United States Patent
Momtaz et al.

(10) Patent No.: US 7,049,856 B2
(45) Date of Patent: May 23, 2006

(54) HIGH SPEED PEAK AMPLITUDE COMPARATOR

(75) Inventors: Afshin Momtaz, Irvine, CA (US); Wee-Guan Tan, Costa Mesa, CA (US); Armond Hairapetian, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/031,102

(22) Filed: Jan. 6, 2005

(65) Prior Publication Data

US 2005/0122137 A1    Jun. 9, 2005

Related U.S. Application Data

(63) Continuation of application No. 09/969,837, filed on Oct. 1, 2001, now Pat. No. 6,888,381.

(51) Int. Cl.
    *G01R 19/00*    (2006.01)
(52) U.S. Cl. .......................... 327/58; 327/62
(58) Field of Classification Search .................. 327/62, 327/63, 65, 71, 77, 78, 79, 80, 58; 330/252, 330/253, 277
    See application file for complete search history.

(56) References Cited

U.S. PATENT DOCUMENTS

| | | | |
|---|---|---|---|
| 3,699,357 A | 10/1972 | Lloyd | 327/58 |
| 4,866,301 A | 9/1989 | Smith | 327/58 |
| 5,041,795 A | 8/1991 | Bowers | 327/561 |
| 5,189,313 A | 2/1993 | Garuts | 327/131 |
| 5,302,863 A * | 4/1994 | Walley et al. | 327/60 |
| 5,381,053 A | 1/1995 | Yasuda | 327/65 |
| 5,631,584 A | 5/1997 | Smith | 327/62 |
| 5,942,921 A | 8/1999 | Talaga, Jr. | 327/77 |
| 6,051,998 A | 4/2000 | Lee et al. | 327/59 |
| 6,388,477 B1 | 5/2002 | Juang | 327/112 |

OTHER PUBLICATIONS

European Search Report dated Dec. 18, 2003, for EP Application No. 02 25 4838.

* cited by examiner

*Primary Examiner*—Linh My Nguyen
(74) *Attorney, Agent, or Firm*—Christie, Parker & Hale, LLP

(57) ABSTRACT

Various methods and circuits for implementing high speed peak amplitude comparison. The invention achieves higher speed of operation by eliminating the slow feedback loop commonly employed in peak detection. In one embodiment, the invention directly compares a signal that represents the peak amplitude of the input signal minus a small voltage drop, to a modified reference voltage. The modified reference voltage corresponds to the reference voltage that is adjusted to compensate for the small voltage drop in the maximum input voltage. In another embodiment, the invention implements a differential version of the peak amplitude comparator to obtain better noise rejection and reduced effective offset among other advantages.

22 Claims, 2 Drawing Sheets

HIGH SPEED PEAK AMPLITUDE COMPARATOR

CROSS-REFERENCE TO RELATED APPLICATION(S)

This application is a continuation of U.S. patent application Ser. No. 09/969,837, filed Oct. 1, 2001 now U.S. Pat. No. 6,888,381, and entitled "HIGH SPEED PEAK AMPLITUDE COMPARATOR," the entire contents of which are hereby incorporated by reference.

BACKGROUND OF THE INVENTION

The present invention relates in general to integrated circuitry, and in particular to various implementations for a high speed peak amplitude comparator.

There are many circuit applications wherein there is a need to detect the peak amplitude of a received signal. In data communication circuits, for example, the receiver must be able to distinguish between a noise and weak but valid signal at its input. To accomplish this, typically the peak amplitude of the input signal is first measured and then compared to a threshold voltage to determine whether the input signal is a valid signal. FIG. 1 depicts a typical implementation for a conventional peak amplitude detector 100. An amplifier 102 and transistor M1 are connected in a feedback configuration with the input signal Vin being applied to one input of amplifier 102. As Vin rises and transistor M1 turns on, the amplitude of the signal Vc (at node 104) essentially follows that of Vin. When Vin drops from its peak value, transistor M1 turns off, but capacitor C1 maintains the charge at node 104 at the peak value of Vc. Thus, the amplitude of the signal Vc always reflects the peak amplitude of Vin. A comparator 106 is then used to compare the amplitude of Vc with a reference voltage Vref, and generates a binary signal at its output to indicate whether the amplitude of Vc (=to peak value of Vin) is greater than or smaller than Vref. A current source I0 is provided to allow capacitor C1 to discharge in case of random glitches at the input. Current I0 is made very small relative to the size of capacitor C1. As long as an input signal is present, Vin updates the charge stored by capacitor C1 thus the slow discharge does not result in an appreciable reduction in Vc in the absence of a glitch.

A drawback of the circuit of FIG. 1 is that because of the feedback loop its speed of operation is limited. Thus, for very high speed applications such as data communication circuitry in the GigaHz range (e.g., SONET OC192), peak detectors with this type of feedback loop are not suitable. This has created a need for peak amplitude detection circuit techniques that are operable at very high frequencies.

BRIEF SUMMARY OF THE INVENTION

The present invention provides various methods and circuits for implementing high speed peak amplitude comparison. Broadly, the invention achieves higher speed of operation by eliminating the slow feedback loop commonly employed in peak detection. In one embodiment, the invention directly compares a signal that represents the peak amplitude of the input signal minus a small voltage drop to a modified reference voltage. The modified reference voltage corresponds to the reference voltage that is adjusted to compensate for the small voltage drop in the maximum input voltage. As thus constructed, a comparison of the two voltages performs the intended function without the need for a feedback loop. In another embodiment, the invention implements a differential version of the peak amplitude comparator to obtain better noise rejection and reduced effective offset among other advantages.

Accordingly, in one embodiment, the present invention provides a peak amplitude comparator including an input circuit having an input terminal coupled to receive an input signal, and configured to generate at an output terminal a first signal with an amplitude that is substantially equal to a peak amplitude of the input signal minus a predetermined voltage drop; a reference circuit having an input terminal coupled to receive a reference voltage and configured to generate at an output terminal a second signal with an amplitude that is substantially equal to the reference voltage minus the predetermined voltage drop; and a comparator having a first terminal coupled to receive the first signal and a second terminal coupled to receive the second signal.

In a more specific embodiment, the input circuit includes: a transistor having a gate terminal couple to receive the input signal, a first source/drain terminal coupled to a logic high power supply and a second source/drain terminal coupled to the output terminal of the input circuit; a capacitor coupled to the second source/drain terminal of the transistor; and a current source coupled to the second source/drain terminal of the transistor, wherein the predetermined voltage drop is substantially equal to a threshold voltage of the transistor.

In another embodiment, the present invention provides a differential peak amplitude comparator including an input circuit having first and second input terminals coupled to respectively receive differential first and second input signals, and configured to generate at an output terminal a first signal with an amplitude that is substantially equal to a peak amplitude of either of the first and second input signals minus a predetermined voltage drop; a reference circuit having an input terminal coupled to receive a reference voltage and configured to generate at an output terminal a second signal with an amplitude that is substantially equal to the reference voltage minus the predetermined voltage drop; and a comparator having a first terminal coupled to receive the first signal and a second terminal coupled to receive the second signal.

In yet another embodiment, the present invention provides a method for comparing a peak amplitude of an input signal to a reference voltage, including storing on a first node a first signal having an amplitude that is substantially equal to a peak amplitude of the input signal minus a predetermined voltage drop; applying to a second node a second signal with an amplitude that is substantially equal to the reference voltage minus the predetermined voltage drop; and comparing a magnitude of the first signal to a magnitude of the second signal.

The following detailed description and the accompanying drawings provide a better understanding of the nature and advantages of the high speed peak amplitude comparator according to the present invention.

DETAILED DESCRIPTION OF THE INVENTION

Figure 2:
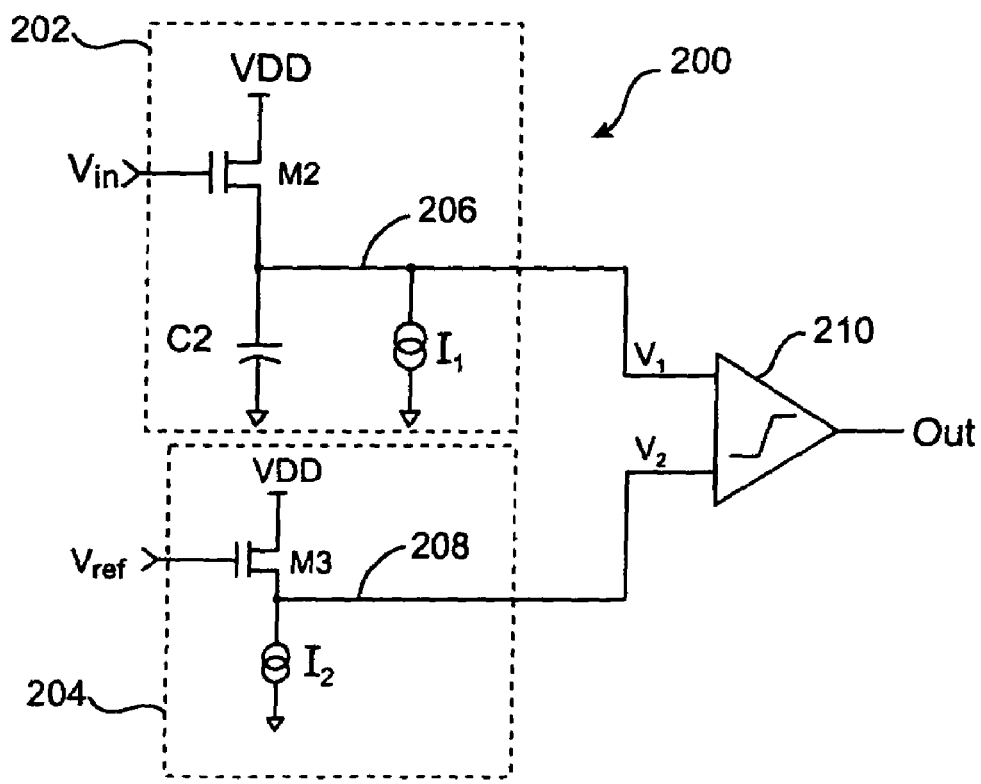
FIG. 2 is a simplified circuit schematic for an exemplary implementation of a peak amplitude comparator according to one embodiment of the present invention.

To attain higher speed of operation, it is desirable to eliminate the feedback loop that is commonly employed in peak detect circuitry. Referring to FIG. 2, there is shown a simplified circuit schematic for an exemplary implementation of a peak amplitude comparator 200 according to one embodiment of the present invention. Peak amplitude comparator 200 includes an input circuit (or input path) 202 and a reference circuit (or reference path) 204. Input circuit 202 includes a field effect transistor M2 that receives the input signal Vin at its gate terminal. Transistor M2 has its drain terminal connected to the positive power supply VDD and its source terminal connected to node 206. A capacitor C2 connects between node 206 and ground (or negative power supply VSS depending on the implementation). A current source device I1 connects in parallel with capacitor C2 and provides a discharge path for capacitor C2 to address glitch conditions at the input. Reference circuit 204 includes a field effect transistor M3 that receives a reference signal Vref at its gate terminal. Transistor M3 has its drain terminal connected to VDD and its source terminal connected to node 208. A current source device I2, preferably replicating current source device I1, connects between the source terminal of transistor M3 and ground. A comparator 210 receives node 206 at one input and node 208 at another. The output of comparator 210 provides the output OUT of the circuit. Current source devices I1 and I2 may be implemented by a transistor that has its gate driven by a bias voltage. It is to be understood that the specific implementation shown in FIG. 2 is for illustrative purposes only, and that the invention can be implemented with variations and modifications to this specific embodiment. For example, transistors M2 and M3 (or M4 and M5 in the embodiment shown in FIG. 3) may be connected to another voltage, and possibly coupled to VDD via another circuit element such as a resistor. Also, some applications may include filtering such as an RC low pass filter at node 206.

Figure 1:
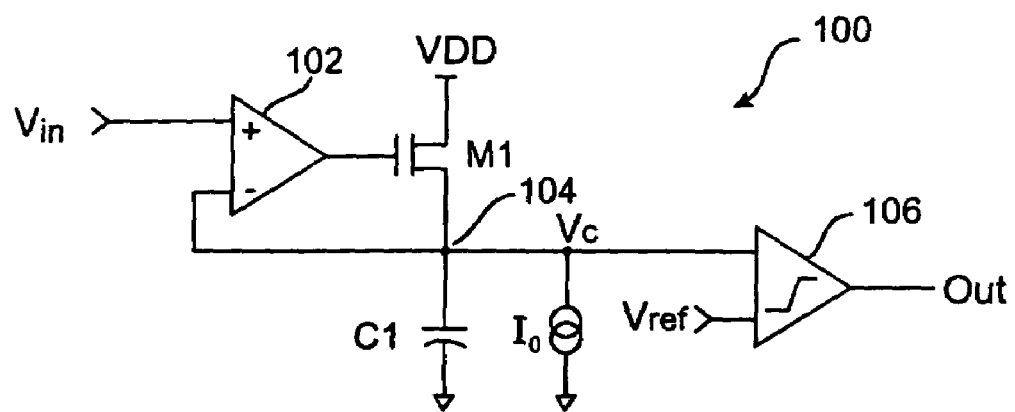
FIG. 1 depicts a typical circuit implementation for a conventional peak detector.

In operation, Vin turns on transistor M2 when its magnitude is one Vth greater than the signal level at its source terminal (node 206), where Vth is the threshold voltage of transistor M2. With transistor M2 turned on, voltage V1 at node 206 increases as Vin increases but is lower than Vin by one Vth (i.e., V1=Vin−Vth). However, after Vin reaches its peak amplitude, Vinmax, and starts to decrease, transistor M2 turns off since capacitor C2 operates to maintain the charge at node 206. With M2 turned off, capacitor C2 holds voltage V1 constant at value [Vinmax−Vth]. Signal V1 is, therefore, not the true peak of the input signal Vin, and instead is one Vth lower than the peak. To compensate for this difference, instead of applying reference signal Vref directly to the other input of comparator 210, the magnitude of Vref is adjusted by reference circuit 204. Reference circuit 204 includes a circuit that essentially replicates input circuit 202. Vref is applied to the gate terminal of transistor M3, and transistor M3 is biased by current source I2. Signal V2 at the source terminal of transistor M3 is thus equal to Vref−Vth where Vth is the threshold voltage of transistor M3. It is preferable to use a transistor and a current source device in reference circuit 204 that is of similar size and layout as those in input circuit 202. Comparator 210 thus compares [V1 =Vinmax−Vth] at node 206 with [V2=Vref−Vth] at node 208. In this fashion the circuit of FIG. 2 effectively compares Vinmax with Vref without the use of any feedback loops. This circuit can operate at much higher frequencies compared to the prior art peak detectors of the type shown in FIG. 1.

Figure 3:
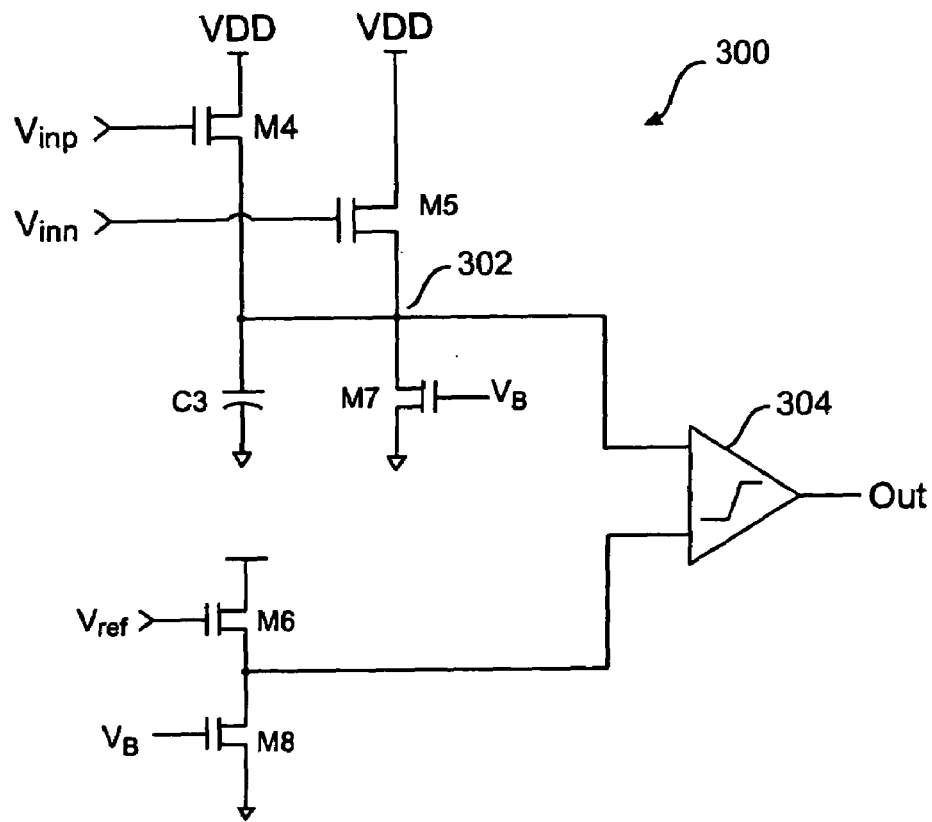
FIG. 3 is a simplified circuit schematic for an exemplary implementation of a differential peak amplitude comparator according to another embodiment of the present invention.

In an alternative embodiment, the present invention provides a differential implementation for a peak amplitude comparator. FIG. 3 is a simplified circuit schematic for an exemplary implementation of a differential peak amplitude comparator 300 according to this embodiment of the present invention. Circuit 300 is similar to the single-ended circuit of FIG. 2 in most respects except for the inclusion of a second transistor in the input path. Thus, the circuit includes a first transistor M4 that receives the positive half Vinp of the differential input signal and a second transistor M5 that receives the negative half Vinn of the differential input signal. FIG. 3 also shows the use of transistors M7 and M8 each having its gate driven by a bias voltage Vb as the current source devices. It is to be understood that other types of implementations for current source devices are possible. For example, the current source can be implemented using resistors or cascode connected transistors, and the like.

The operation of the circuit of FIG. 3 is very similar to the single-ended peak amplitude comparator shown in FIG. 2, except that the differential implementation offers a number of advantages. First, due to the differential nature of the circuit, better noise rejection is obtained. Secondly, this implementation is better in handling a long stream of zeros (logic low level) at the input. With the single-ended approach, a stream of zeros at the input may cause the storage capacitor to gradually discharge through I1 well below the peak value. With the differential implementation shown in FIG. 3, a stream of zeros at one input, say the positive input Vinp, means that the other input, Vinn receives a stream of ones (logic high level). Since node 302 responds to both inputs, capacitor C3 would remain charged to the peak value of the input signal even with a stream of zeros at Vinp.

Figure 4:
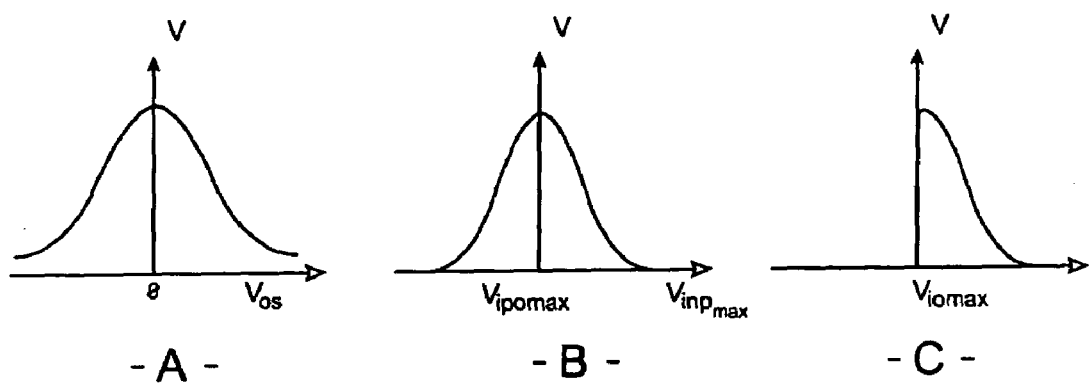
FIGS. 4A, 4B and 4C illustrate the offset behavior of the various embodiments of peak amplitude detectors and comparators described herein.

Another advantage of the differential peak amplitude comparator of FIG. 3 is a significant reduction in offset. In a typical circuit application employing the peak amplitude comparator of the present invention there are a number of sources of offset. The high speed input signal that is received from the transmission line is typically amplified before it is applied to the peak amplitude comparator. Transistor mismatch and amplifier systematic offset as well as offset inherent in the differential signal contribute to the DC offset Vos. Differences between the input path and the reference path as well as transistor mismatch in the comparator (304) also add to the DC offset Vos. The magnitude and sign of this offset signal Vos varies from chip to chip and depends on the input signal to the chip. Its distribution can be approximated by a bell shaped curve centered around zero as shown in FIG. 4A. Hence, the peak value of Vinp (i.e., Vinpmax) is also a bell shaped curve with its center at the ideal value when the offset signal Vos equals zero as shown in FIG. 4B. With the differential implementation, if Vos is negative, Vinpmax is reduced but Vinnmax is increased, and the peak value becomes [Viomax+Vos], where Viomax is the ideal peak value (with no offset) of both Vinp and Vinn. That is, with the differential implementation shown in FIG. 3, the two-sided offset distribution is rectified to only the positive side as shown in FIG. 4C. This leads to a direct reduction in the range of the peak value that is impacted by offset.

The present invention thus provides method and circuitry for implementing high speed peak amplitude comparators.

Two specific embodiments, one single-ended and one differential implementations, have been described wherein peak comparison is accomplished without the need for a feedback loop. While the above provides a detailed description of certain specific embodiments of the invention, various alternatives, modifications and equivalents are possible. For example, the illustrative embodiments shown in FIGS. 2 and 3 employ metal-oxide field effect transistor (MOSFET) technology. The present invention, however, is not limited to MOSFET technology and other technologies such as bipolar, GaAs or GaAs on silicon and the like may be used to implement the present invention. The scope of the present invention is thus not limited to the specific embodiments described, and is instead defined by the following claims and their full breadth of equivalents.

What is claimed is:

1. A peak amplitude comparator comprising:
    a first transistor having a control terminal coupled to receive an input signal, a first terminal coupled to a power supply, and a second terminal coupled to apply a first signal;
    a capacitor coupled to the second terminal of the first transistor and for maintaining the first signal;
    a second transistor having a control terminal coupled to receive a reference voltage, a first terminal coupled to the power supply, and a second terminal coupled to apply a second signal;
    a comparator having a first terminal coupled to receive the first signal and a second terminal coupled to receive the second signal, wherein the input signal comprises a first part of a differential input signal; and
    a third transistor having a gate terminal coupled to receive a second part of the differential input signal, a first terminal coupled to the power supply, and a second terminal coupled to the capacitor that is also coupled to the second terminal of the first transistor.

2. The peak amplitude comparator of claim 1, wherein the first signal has an amplitude substantially equal to a peak amplitude of the input signal minus a threshold voltage of the first transistor.

3. The peak amplitude comparator of claim 2, wherein the second signal has an amplitude substantially equal to the reference voltage minus a threshold voltage of the second transistor.

4. The peak amplitude comparator of claim 3, wherein the threshold voltage of the first transistor substantially equals the threshold voltage of the second transistor.

5. The peak amplitude comparator of claim 1, wherein the comparator is configured to compare a magnitude of the first signal to a magnitude of the second signal.

6. The peak amplitude comparator of claim 1, further comprising:
    a current source coupled in parallel with the capacitor to the second terminal of the first transistor, the current source providing a discharge path for the capacitor.

7. The peak amplitude comparator of claim 1, further comprising:
    a first current source coupled in parallel with the capacitor to the second terminal of the first transistor; and
    a second current source coupled to the second terminal of the second transistor.

8. The peak amplitude comparator of claim 7, wherein the second current source substantially replicates the first current source.

9. A differential peak amplitude comparator comprising:
    a first transistor having a control terminal coupled to receive a first input signal, a first terminal coupled to a power supply, and a second terminal coupled to a first node;
    a second transistor having a control terminal coupled to receive a second input signal, a first terminal coupled to the power supply, and a second terminal coupled to the first node;
    a capacitor coupled to the second terminals of the first and second transistors via the first node;
    a reference circuit coupled to a second node; and
    a comparator having a first terminal coupled to the first node and a second terminal coupled to the second node.

10. The differential peak amplitude comparator of claim 9, wherein the first and second transistor are configured to apply at the first node a first signal with an amplitude that is substantially equal to a peak amplitude of either of the first and second input signals minus a predetermined voltage drop and wherein the reference circuit is configured to generate at the second node a second signal with an amplitude that is substantially equal to the reference voltage minus the predetermined voltage drop.

11. The differential peak amplitude comparator of claim 10, further comprising:
    a current source coupled to the second terminals of the first and second transistors.

12. The differential peak amplitude comparator of claim 9, wherein the reference circuit comprises:
    a third transistor having a gate terminal coupled to receive a reference voltage, a first terminal coupled to the power supply, and a second terminal coupled to the second node.

13. The differential peak amplitude comparator of claim 10, wherein the predetermined voltage drop is substantially equal to a threshold voltage of the first transistor.

14. A peak amplitude comparator comprising:
    a first transistor having a control terminal coupled to receive an input signal, a first terminal coupled to a power supply, and a second terminal coupled to apply a first signal;
    a second transistor having a control terminal coupled to receive a reference voltage, a first terminal coupled to the power supply, and a second terminal coupled to apply a second signal;
    a comparator having a first terminal coupled to receive the first signal and a second terminal coupled to receive the second signal, wherein the input signal comprises a first part of a differential input signal; and
    a third transistor having a gate terminal coupled to receive a second part of the differential input signal, a first terminal coupled to the power supply, and a second terminal coupled to the second terminal of the first transistor.

15. The peak amplitude comparator of claim 14, wherein the first signal has an amplitude substantially equal to a peak amplitude of the input signal minus a threshold voltage of the first transistor.

16. The peak amplitude comparator of claim 14, wherein the second signal has an amplitude substantially equal to the reference voltage minus a threshold voltage of the second transistor.

17. The peak amplitude comparator of claim 14, wherein the threshold voltage of the first transistor substantially equals the threshold voltage of the second transistor.

18. The peak amplitude comparator of claim 14, wherein the comparator is configured to compare a magnitude of the first signal to a magnitude of the second signal.

19. The peak amplitude comparator of claim 14, further comprising:
   a current source coupled to the second terminal of the first transistor.

20. The peak amplitude comparator of claim 14, further comprising:
   a fourth transistor coupled to the second terminal of the first transistor and having a control terminal coupled to receive a bias voltage.

21. The peak amplitude comparator of claim 14, further comprising:
   a first current source coupled to the second terminal of the first transistor; and
   a second current source coupled to the second terminal of the second transistor.

22. The peak amplitude comparator of claim 14, further comprising:
   a fourth transistor coupled to the second terminal of the first transistor and having a control terminal coupled to receive a bias voltage; and
   a fifth transistor coupled to the second terminal of the second transistor and having a control terminal coupled to receive the bias voltage.

* * * * *